(12) United States Patent
Jin et al.

(10) Patent No.: US 7,186,631 B2
(45) Date of Patent: Mar. 6, 2007

(54) METHOD FOR MANUFACTURING A SEMICONDUCTOR DEVICE

(75) Inventors: Seung Woo Jin, Gyunggi-do (KR); Min Yong Lee, Seoul (KR); Kyoung Bong Rouh, Gyunggi-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/201,843

(22) Filed: Aug. 11, 2005

(65) Prior Publication Data

US 2006/0141690 A1 Jun. 29, 2006

(30) Foreign Application Priority Data

Dec. 23, 2004 (KR) ............... 10-2004-0111389

(51) Int. Cl.
*H01L 21/26* (2006.01)
(52) U.S. Cl. ............... 438/515; 438/532; 438/918
(58) Field of Classification Search ........... 438/515, 438/517, 532, 918, FOR. 154, FOR. 155, 438/FOR. 444
See application file for complete search history.

(56) References Cited

U.S. PATENT DOCUMENTS

| | | | | |
|---|---|---|---|---|
| 4,698,900 A | * | 10/1987 | Esquivel | 438/262 |
| 4,713,329 A | * | 12/1987 | Fang et al. | 438/220 |
| 4,895,520 A | * | 1/1990 | Berg | 438/289 |
| 4,931,411 A | * | 6/1990 | Tigelaar et al. | 438/201 |
| 5,151,374 A | * | 9/1992 | Wu | 438/154 |
| 5,267,194 A | * | 11/1993 | Jang | 365/185.15 |
| 5,354,700 A | * | 10/1994 | Huang et al. | 438/151 |
| 5,464,782 A | * | 11/1995 | Koh | 438/303 |
| 5,534,451 A | * | 7/1996 | Wuu et al. | 438/152 |
| 5,554,854 A | * | 9/1996 | Blake | 250/492.21 |
| 5,913,131 A | * | 6/1999 | Hossain et al. | 438/423 |
| 2001/0016389 A1 | * | 8/2001 | Wang et al. | 438/276 |
| 2002/0027804 A1 | * | 3/2002 | Wong | 365/185.05 |
| 2002/0096706 A1 | * | 7/2002 | Rudeck et al. | 257/316 |
| 2004/0028468 A1 | * | 2/2004 | Wappes et al. | 403/290 |
| 2004/0185620 A1 | * | 9/2004 | Rudeck et al. | 438/257 |
| 2004/0232609 A1 | * | 11/2004 | Stefanoni | 270/5.02 |
| 2005/0164461 A1 | * | 7/2005 | Chen et al. | 438/305 |
| 2005/0250240 A1 | * | 11/2005 | Hong et al. | 438/57 |

FOREIGN PATENT DOCUMENTS

| | | |
|---|---|---|
| KR | 1020000007411 A | 2/2000 |
| KR | 1020030054050 A | 7/2003 |
| KR | 1020040026332 A | 3/2004 |

* cited by examiner

*Primary Examiner*—George Fourson
(74) *Attorney, Agent, or Firm*—Marshall, Gerstein & Borun LLP

(57) ABSTRACT

Provided is a method for manufacturing a semiconductor device comprising forming a device isolation layer on a semiconductor substrate; forming gate insulating layers on the upper part of the semiconductor substrate having the device isolation layers formed thereon; forming an undoped layer for a gate electrode; implanting mixed dopant ions consisting of at least two dopant ions containing $^{11}B$ ions into the undoped layer, utilizing an ion-implantation mask; and heat-treating the mixed dopant ion-implanted layer.

13 Claims, 2 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly to a method for manufacturing a semiconductor device to form a gate electrode composed of p-type doped polysilicon.

2. Description of the Related Art

Semiconductor devices such as semiconductor memories include a great number of MOS transistors, and operation characteristics thereof significantly depend upon the characteristics of the MOS transistors.

Generally, threshold voltage differences occur between NMOS transistors and PMOS transistors, in which channels are formed on surfaces of semiconductor substrates in CMOS transistors. Such voltage differences induce a variety of limiting factors associated with designing or manufacturing semiconductor devices. As such, n-type dopants are applied to polysilicon of NMOS gate electrodes and p-type dopants are applied to polysilicon of PMOS gate electrodes (also referred to as "dual gate structures").

In the dual gate of the CMOS transistor, since polysilicon layers for respective gate electrodes of the PMOS and NMOS are simultaneously vapor-deposited and patterned, undoped polysilicon is first vapor-deposited, then P, as the n-type dopant, is ion-implanted into the gate region of the NMOS, and B, as the p-type dopant, is ion-implanted into the gate region of the PMOS.

After heat treatment to activate dopants in the polysilicon layers, the doped polysilicon is etched, via an etching process, to form NMOS gate electrodes and PMOS gate electrodes.

Conventionally, $^{49}BF2$ has been used as the B dopant of the PMOS gate electrode of the CMOS transistor. When $^{49}BF2$ is used as the B dopant, the ion-implantation dose of F ions is twice that of the dose of B ions. This is advantageous in terms of inhibition of B ion diffusion by F ions, but $^{19}F$ amplifies Transient Enhanced Diffusion (TED) of $^{11}B$ which in turn leads to a threshold voltage shift (Vt shift) due to penetration of $^{11}B$. In addition, $^{49}BF2$ also suffers from increased thickness of an effective gate insulating layer due to the effects of $^{19}F$, thereby resulting in reduced drive current.

As such, in an attempt to solve these problems, a method of implantation $^{11}B$ ions as the B dopant of the PMOS gate electrodes has been applied. However, due to the low implantation energy of $^{11}B$ upon implantation, this method suffers from deterioration of mass productivity upon manufacturing semiconductor devices.

SUMMARY OF THE INVENTION

Therefore, the present invention has been made in view of the above problems, and it is an object of the present invention to provide a method for manufacturing a semiconductor device, capable of preventing threshold voltage shift (Vt shift) due to penetration of $^{11}B$ and decrease in drive current due to increased thickness of an effective gate insulating layer, and capable of improving yield and productivity of electrodes, by implanting a $^{49}BF2+^{11}B$ mixed dopant, a $^{30}BF+^{11}B$ mixed dopant, or a $^{30}BF$ containing B ions, when implanting B dopant into an undoped layer of the gate of a MOS device.

In accordance with the present invention, the above and other objects can be accomplished by the provision of a method for manufacturing a semiconductor device, comprising forming device isolation layers on a semiconductor substrate; forming a gate insulating layer on the upper part of the semiconductor substrate having the device isolation layers formed thereon; forming an undoped layer for a gate electrode; implanting mixed dopant ions consisting of at least two dopant ions containing $^{11}B$ ions into the undoped layer, utilizing an ion-implantation mask; and heat-treating the mixed dopant ion-implanted layer.

In the present invention, the mixed dopant ions preferably contain $^{49}BF2$ and $^{11}B$.

Preferably, the step of implanting the mixed dopant ions may be carried out in the order of $^{49}BF2$ and $^{11}B$ or vice versa.

Preferably, during implantation of $^{49}BF2$ ions, applied energy is in the range of 1 KeV to 30 KeV, dose is in the range of $1.0\,E14/cm^2$ to $1.0\,E16/cm^2$, and tilt degree is in the range of $0°$ to $7°$.

Preferably, during implantation of $^{11}B$ ions, applied energy is in the range of 1 KeV to 30 KeV, dose is in the range of $1.0\,E14/cm^2$ to $1.0\,E16/cm^2$, and tilt degree is in the range of $0°$ to $7°$.

In the present invention, the mixed dopant ions preferably contain $^{30}BF$ and $^{11}B$.

Preferably, the step of implanting the mixed dopant ions may be carried out in the order of $^{30}BF$ and $^{11}B$ or vice versa.

Preferably, during implantation of $^{30}BF$ ions, applied energy is in the range of 1 KeV to 30 KeV, dose is in the range of $1.0\,E14/cm^2$ to $1.0\,E16/cm^2$, and tilt degree is in the range of $0°$ to $7°$.

Preferably, during implantation of $^{11}B$ ions, applied energy is in the range of 1 KeV to 30 KeV, dose is in the range of $1.0\,E14/cm^2$ to $1.0\,E16/cm^2$, and tilt degree is in the range of $0°$ to $7°$.

In the present invention, implantation of the mixed dopant ions is preferably carried out using ion implantation equipment or plasma ion doping equipment.

In accordance with another aspect of the present invention, there is provided a method for manufacturing a semiconductor device, comprising forming device isolation layers on a semiconductor substrate; forming a gate insulating layer on the upper part of the semiconductor substrate having the device isolation layers formed thereon; forming an undoped layer for a gate electrode; implanting $^{30}BF$ ions into the undoped layer, utilizing an ion-implantation mask; and subjecting the ion-implanted layer to heat-treatment.

In the present invention, during implantation of $^{30}B$ ions, applied energy is in the range of 1 KeV to 30 KeV, dose is in the range of $1.0\,E14/cm^2$ to $1.0\,E16/cm^2$, and tilt degree is in the range of $0°$ to $7°$.

Implantation of $^{30}BF$ ions is preferably carried out using ion implantation equipment or plasma ion doping equipment.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, the present invention will be described in more detail with reference to the following embodiments. These embodiments are provided only for illustrating the present invention and should not be construed as limiting the scope and spirit of the present invention.

FIGS. 1 through 4 illustrate a process of manufacturing a semiconductor device in accordance with one embodiment of the present invention, and details thereof will be described with reference to the accompanying drawings.

Figure 1:
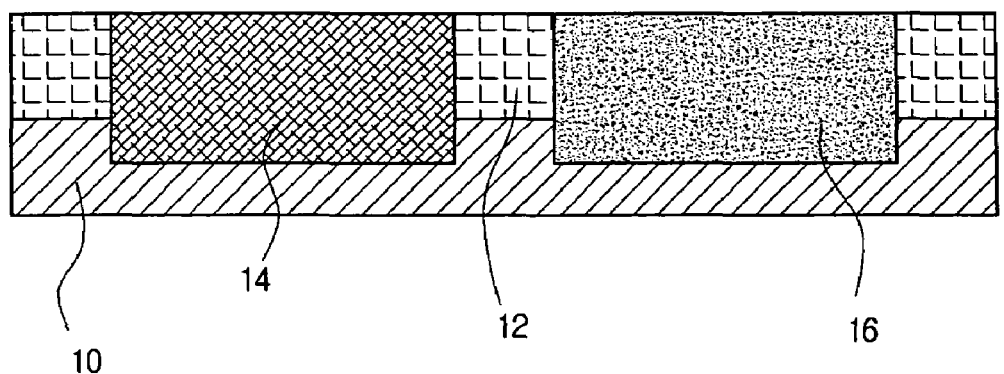
FIG. 1 is a vertical cross-sectional view illustrating formation of device isolation layers and wells in a process of manufacturing a semiconductor device in accordance with the present invention.

As shown in FIG. 1, device isolation layers 12 defining active regions and non-active regions of the semiconductor device are first formed on a semiconductor substrate 10. Then, an N-well 14 and P-well 16 are formed on the substrate 10 having the device isolation layers 12 formed thereon, respectively.

Figure 2:
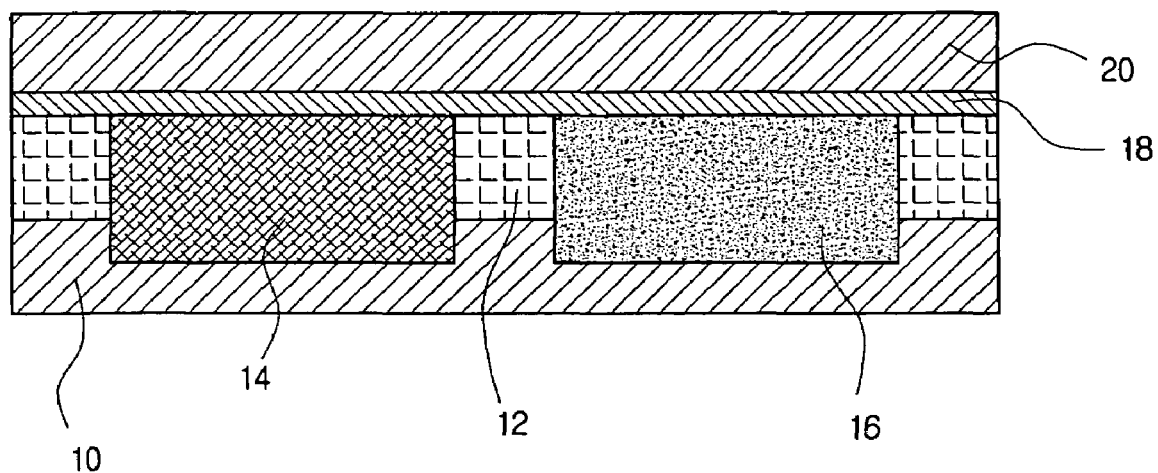
FIG. 2 is a vertical cross-sectional view illustrating formation of a gate insulating layer and gate conductive layer in a process of manufacturing a semiconductor device in accordance with the present invention.

Next, as shown in FIG. 2, a gate insulating layer 18 having a thickness of about 30 to 50 Å is formed over the entire upper surface of the semiconductor substrate 10. The gate insulating layer 18 is oxidized into silicon oxide layer by performing a wet oxidation process at about 800° C.

Next, as an undoped layer 20, an amorphous silicon layer is vapor-deposited on the upper part of the gate insulating layer 18. The undoped layer 20 is vapor-deposited to a thickness of 700 to 1000 Å at a temperature of 480 to 550° C. and pressure of 0.1 to 1.0 torr, using $Si_2H_6$.

Figure 3:
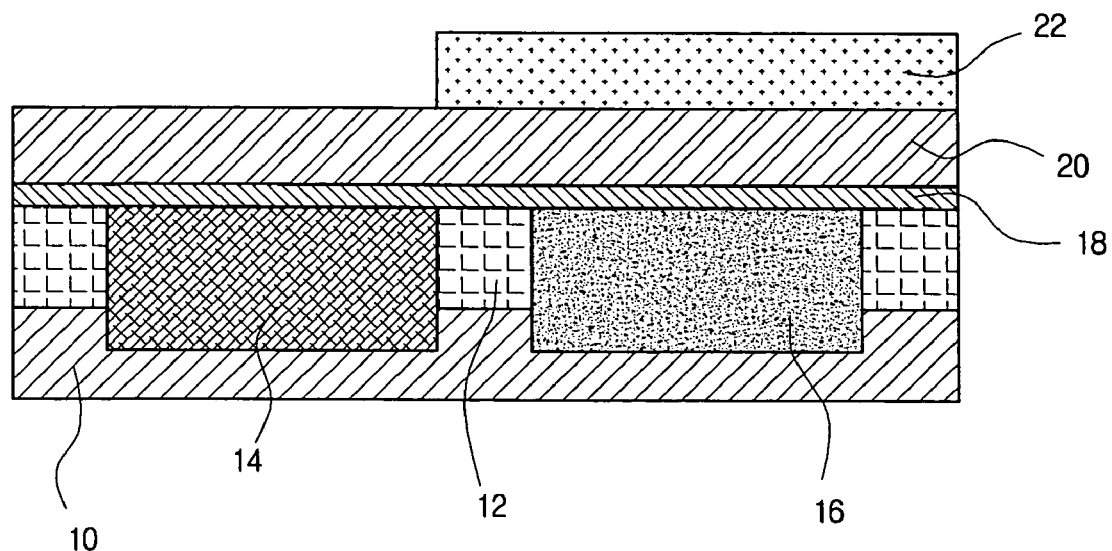
FIG. 3 is a vertical cross-sectional view illustrating formation of patterns to expose a PMOS region in the process of manufacturing a semiconductor device in accordance with the present invention.

Subsequently, as shown in FIG. 3, a photoresist is applied to the entire surface of the undoped layer 20, which is then exposed to light and developed to form photoresist patterns 22 exposing only the undoped layer 20 on the N-well 14 region.

Figure 4:
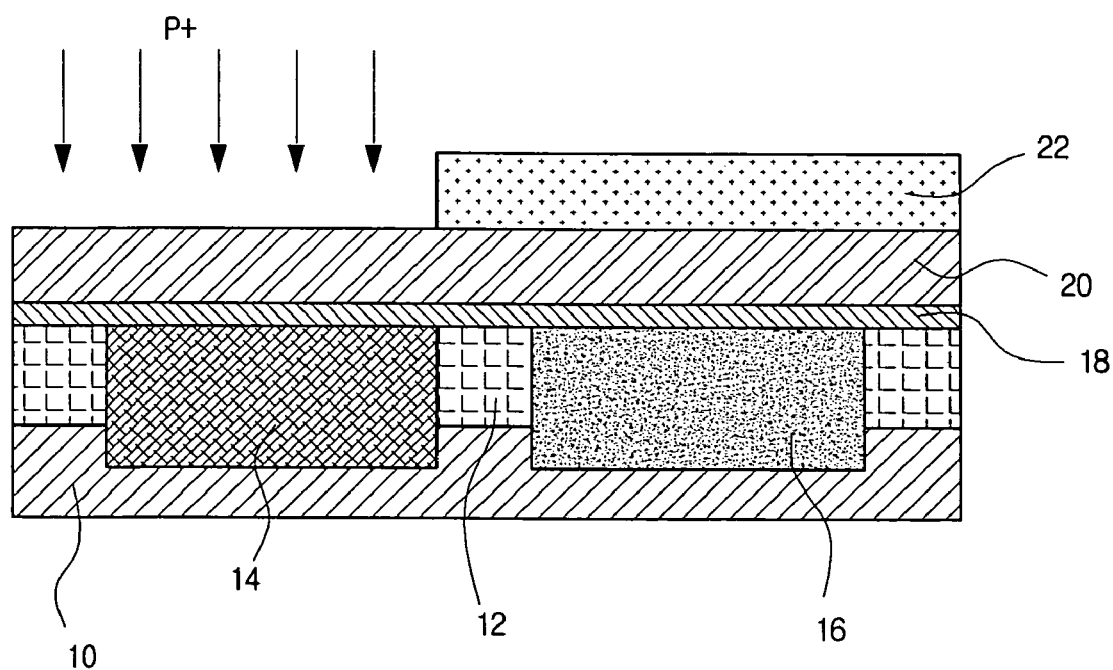
FIG. 4 is a vertical cross-sectional view illustrating implantation of p-type dopant ions in a process of manufacturing a semiconductor device in accordance with the present invention.

As shown in FIG. 4, in accordance with the present invention, in order to implant the p-type dopant ions (B ions) into the undoped layer 20, the mixed dopant ions consisting of at least two dopant ions containing $^{11}B$ ions are implanted. Herein, a mixed dopant containing $^{49}BF2$ and $^{11}B$ is used as the mixed dopant ions, and implantation of the mixed dopant ions may be carried out in any order. In addition, ion-implantation may be carried out by ion implantation methods or methods using plasma ion doping equipment.

Upon implanting $^{49}BF2$ ions, applied energy is in the range of 1 KeV to 30 KeV, dose is in the range of 1.0 $E14/cm^2$ to 1.0 $E16/cm^2$, and the tilt degree is in the range of 0° to 7°. Further, upon implanting $^{11}B$ ions, the applied energy is in the range of 1 KeV to 30 KeV, dose is in the range of 1.0 $E14/cm^2$ to 1.0 $E16/cm^2$, and tilt degree is in the range of 0° to Upon implanting tilt ions, ion-implantation may be carried out via a bi-mode or quad-mode tilt ion-implantation method.

Next, the photoresist patterns (22) are removed, photoresist patterns exposing only the amorphous silicon layer in the region of the P-well 16 are formed and then the P-type dopant ion, $^{31}P$, is implanted as the n-type impurity (not shown). Upon implanting $^{31}P$ ions, the applied energy is between 12 KeV and 20 KeV, and the dose is between 1.0 $E14/cm^2$ and 1.0 $E16/cm^2$.

Next, a heat treatment process such as rapid thermal process (RTP) is then applied to activate the p- and n-type dopant ions in the doped polysilicon layer while crystallizing the amorphous silicon layer into doped polysilicon layer.

Next, the respective dual gate of PMOS and NMOS gate electrodes are formed on the upper parts of the N-well 12 and P-well 14 by patterning doped polysilicon layer via photographing and etching processes utilizing a gate mask. At this time, the gate insulating layer 18 is also etched to be aligned with the dual gate.

As such, in the method for manufacturing the semiconductor device in accordance with one embodiment of the present invention, upon implanting p-type dopant ions of the PMOS gate electrode, the total implantation dose is divided into $^{49}BF2$ and $^{11}B$ ions which are then implanted, thereby decreasing the dose amount of $^{19}F$. Thus, it is possible to reduce TED (Transient Enhanced Diffusion) of $^{11}B$ by $^{19}F$ leading to inhibition of threshold voltage shift due to penetration of $^{11}B$ and it is also possible to prevent increase in the thickness of effective gate insulating layer by the effects of $^{19}F$ leading to inhibition of the drive current reduction phenomena. In addition, upon manufacturing the semiconductor device, it is also possible to enhance productivity by reducing a fraction of low-energy $^{11}B$.

In another embodiment of the present invention, unlike the above-mentioned embodiment, upon implanting p-type dopant ions of the PMOS gate electrode, mixed dopant ions consisting of at least two dopant ions containing $^{11}B$ ions, i.e., the mixed dopant ions containing $^{30}BF$ and $^{11}B$ are employed. Ion-implantation may be carried out in any order, via ion implantation methods or methods using plasma ion doping equipments.

During implantation of $^{30}BF$ ions, applied energy is in the range of 1 KeV to 30 KeV, dose is in the range of 1.0 $E14/cm^2$ to 1.0 $E16/cm^2$, and tilt degree is in the range of 0° to 7°. Whereas, upon implanting $^{11}B$ ions, applied energy is in the range of 1 KeV to 30 KeV, dose is in the range of 1.0 $E14/cm^2$ to 1.0 $E16/cm^2$, and tilt degree is in the range of 0° to 7°. Upon implanting tilted ions, ion-implantation may be carried out via a bi-mode or quad-mode tilt ion-implantation method.

As such, in the method for manufacturing the semiconductor device in accordance with another embodiment of the present invention, upon implanting p-type dopant ions, the total implantation dose is divided into $^{30}BF$ and $^{11}B$ ions which are then implanted, thereby further decreasing the dose amount of $^{19}F$ than in the method of the above-mentioned embodiment. It is possible to reduce TED of $^{11}B$ by $^{19}F$, leading to inhibition of threshold voltage shift due to penetration of $^{11}B$ and it is also possible to prevent increase in the thickness of the effective gate insulating layer by effects of $^{19}F$ leading to inhibition of drive current reduction phenomena. In addition, it is also possible to enhance productivity of the semiconductor device by reducing a fraction of low-energy $^{11}B$.

In a further embodiment of the present invention, upon implanting p-type dopant ions of the PMOS gate electrode, $^{30}BF$ ions, in which $^{19}F$ ions were removed from $^{49}BF2$ ions, alone are ion-implanted via ion implantation methods or methods using plasma ion doping equipments. Upon implanting $^{30}BF$ ions, applied energy is in the range of 1 KeV to 30 KeV, dose is in the range of 1.0 $E14/cm^2$ to 1.0

E16/cm², and tilt degree is in the range of 0° to 7°. Upon implanting tilt ions, ion-implantation may be carried out via a bi-mode or quad-mode tilting ion-implantation method.

Therefore, in a further embodiment of the present invention, by implanting the total dose as $^{30}$BF ions upon implanting p-type dopant ions, it is possible to decrease $^{19}$F dose as in the above-mentioned embodiments thus reducing the TED of $^{11}$B, and inhibit Vt shift due to penetration of $^{11}$B and it is also possible to prevent increase in the thickness of the effective gate insulating layer by effects of $^{19}$F leading to inhibition of drive current reduction phenomena. In addition, it is also possible to enhance mass productivity of the semiconductor device by reducing a fraction of low-energy $^{11}$B.

As apparent from the above description, in accordance with the present invention, by dividing the total implantation dose into $^{49}$BF2 and $^{11}$B ions, or $^{30}$BF and $^{11}$B ions, followed by implanting, or implanting the total implantation dose as $^{30}$BF ions alone, thereby decreasing the dose amount of $^{19}$F, upon implanting p-type dopant ions of the PMOS gate electrode, it is possible to reduce the TED of $^{11}$B by $^{19}$F, leading to inhibition of a threshold voltage shift (Vt shift) due to penetration of $^{11}$B, and it is also possible to prevent any increase in the thickness of effective gate insulating layer by effects of $^{19}$F leading to inhibition of drive current reduction phenomena. In addition, it is also possible to enhance mass productivity of the semiconductor device by reducing a fraction of low-energy $^{11}$B. Therefore, in accordance with the present invention, it is possible to improve product yield and electrical properties of CMOS transistors or semiconductor devices, including PMOS gate electrodes.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device comprising:
    forming device isolation layers on a semiconductor substrate;
    forming a gate insulating layer on the upper part of the semiconductor substrate having the device isolation layers formed thereon;
    forming an undoped layer for a gate electrode;
    implanting mixed dopant ions consisting of at least two dopant ions containing 11B ions into the undoped layer, utilizing an ion-implantation mask; and
    heat-treating the mixed dopant ion-implanted layer.

2. The method according to claim 1, wherein the mixed dopant ions contain $^{49}$BF2 and $^{11}$B.

3. The method according to claim 2, wherein the step of implanting the mixed dopant ions is carried out in the order of $^{49}$BF2 and $^{11}$B or vice versa.

4. The method according to claim 2 or 3, wherein, upon implanting $^{49}$BF2 ions, applied energy is in the range of 1 KeV to 30 KeV, dose is in the range of 1.0 E14/cm² to 1.0 E16/cm², and tilt degree is in the range of 0° to 7°.

5. The method according to claim 2 or 3, wherein, upon implanting $^{11}$B ions, applied energy is in the range of 1 KeV to 30 KeV, dose is in the range of 1.0 E14/cm² to 1.0 E16/cm², and tilt degree is in the range of 0° to 7°.

6. The method according to claim 1, wherein the mixed dopant ions contain $^{30}$BF and $^{11}$B.

7. The method according to claim 6, wherein the step of implanting the mixed dopant ions is carried out in the order of $^{30}$BF and $^{11}$B or vice versa.

8. The method according to claim 6 or 7, wherein, upon implanting $^{30}$BF ions, applied energy is in the range of 1 KeV to 30 KeV, dose is in the range of 1.0 E14/cm² to 1.0 E16/cm², and tilt degree is in the range of 0° to 7°.

9. The method according to claim 6 or 7, wherein, upon implanting $^{11}$B ions, applied energy is in the range of 1 KeV to 30 KeV, dose is in the range of 1.0 E14/cm² to 1.0 E16/cm², and tilt degree is in the range of 0° to 7°.

10. The method according to claim 1, wherein implantation of the mixed dopant ions is carried out using ion implantation equipment or plasma ion doping equipment.

11. A method for manufacturing a semiconductor device comprising:
    forming device isolation layers on a semiconductor substrate;
    forming a gate insulating layer on the upper part of the semiconductor substrate having the device isolation layers formed thereon;
    forming an undoped layer for a gate electrode;
    implanting $^{30}$BF ions into the undoped layer, utilizing an ion-implantation mask; and
    subjecting the ion-implanted layer to heat-treatment.

12. The method according to claim 11, wherein upon implanting $^{30}$BF ions, applied energy is in the range of 1 KeV to 30 KeV, dose is in the range of 1.0 E14/cm² to 1.0 E16/cm², and tilt degree is in the range of 0° to 7°.

13. The method according to claim 11, wherein implantation of $^{30}$BF ions is carried out using ion implantation equipment or plasma ion doping equipment.

* * * * *